United States Patent
Park (10) Patent No.: US 7,387,132 B2
(45) Date of Patent: Jun. 17, 2008

(54) APPARATUS FOR TREATING WAFER

(75) Inventor: Jong-Chul Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 616 days.

(21) Appl. No.: 10/437,594

(22) Filed: May 13, 2003

(65) Prior Publication Data

US 2004/0007257 A1    Jan. 15, 2004

(30) Foreign Application Priority Data

Jul. 12, 2002    (KR)    .............................. 2002-40683

(51) Int. Cl.
*B08B 3/00* (2006.01)
(52) U.S. Cl. .................. 134/153; 134/104.2; 134/157; 134/184; 134/186; 134/902
(58) Field of Classification Search ............... 134/95.2, 134/95.3, 104.2, 133, 153, 157, 184, 186, 134/902
See application file for complete search history.

(56) References Cited

U.S. PATENT DOCUMENTS

| | | | | |
|---|---|---|---|---|
| 4,326,553 A | * | 4/1982 | Hall | 134/153 |
| 4,401,131 A | * | 8/1983 | Lawson | 134/149 |
| 5,485,644 A | * | 1/1996 | Shinbara et al. | 15/21.1 |
| 5,975,098 A | * | 11/1999 | Yoshitani et al. | 134/148 |
| 5,980,647 A | * | 11/1999 | Buker et al. | 134/33 |
| 6,039,059 A | | 3/2000 | Bran | |
| 6,138,694 A | * | 10/2000 | Hansen et al. | 134/58 R |
| 6,158,075 A | * | 12/2000 | Tanaka et al. | 15/102 |
| 6,221,204 B1 | * | 4/2001 | Liu | 156/345.22 |
| 6,431,184 B1 | * | 8/2002 | Taniyama | 134/1.3 |
| 6,539,952 B2 | | 4/2003 | Itzkowitz | |
| 6,752,685 B2 | * | 6/2004 | Ulrich et al. | 451/2 |
| 2001/0032657 A1 | | 10/2001 | Itzkowitz | |

FOREIGN PATENT DOCUMENTS

JP    5217985    8/1993
JP    9045610    2/1997

OTHER PUBLICATIONS

English Language Abstract of Japan Patent No. JP5217985.
English Language Abstract of Japan Patent No. JP9045610.

* cited by examiner

*Primary Examiner*—Joseph L. Perrin
(74) *Attorney, Agent, or Firm*—Marger Johnson & McCollom, P.C.

(57) ABSTRACT

An apparatus for treating a wafer preferably includes a rotating chuck for rotating the wafer and a treating fluid supplying part for supplying the wafer with one or more treating fluids. The treating fluid(s) can be used to clean and/or dry the wafer. The treating fluid supplying part preferably includes a receiving portion for receiving a treating fluid, and a slit communicating with the receiving portion for applying the treating fluid to a surface of the wafer. An ultrasonic oscillating part can be installed in the receiving portion and can apply ultrasonic oscillation to the treating fluid. The treating fluid for applying the ultrasonic oscillation is preferably provided uniformly across the treated surface of the wafer. The effectiveness of the cleaning process can thereby be improved, and damage to patterns formed on the wafer can be reduced.

15 Claims, 10 Drawing Sheets

APPARATUS FOR TREATING WAFER

BACKGROUND OF THE INVENTION

1. Field of the Invention

The present invention relates generally to an apparatus for treating a wafer. More particularly, this invention relates to an apparatus that can clean a wafer by applying a cleaning solution with ultrasonic oscillation and that can dry the wafer using a drying gas.

2. Description of the Related Art

Generally, a semiconductor device is manufactured by repeatedly performing a series of processes on a semiconductor wafer. These processes can include, for instance, a film deposition process, a photolithography process, an etching process, an ion implanting process, a polishing process, a cleaning process, and a drying process. The cleaning and the drying processes are typically performed to remove impurities or undesired films attached to the wafer and to dry the wafer during the other manufacturing processes. The cleaning and drying processes are becoming more important as the patterns formed on the wafer are becoming smaller and as the aspect ratio of the patterns are increasing.

Conventional wafer cleaning equipment includes batch cleaning apparatuses and single wafer rapid cleaning apparatuses. Batch cleaning apparatuses simultaneously clean a plurality of wafers while single wafer rapid cleaning apparatuses sequentially clean a plurality of wafers one wafer at a time.

Batch cleaning apparatuses have a cleaning bath that includes a cleaning solution used to simultaneously clean the plurality of wafers. An ultrasonic oscillation may be applied to the cleaning solution of the batch cleaning apparatus to increase the efficiency of the cleaning process. Single wafer rapid cleaning apparatuses have a chuck for supporting a wafer and nozzles for providing a cleaning solution to upper and lower faces of the wafer. In the single wafer cleaning apparatus, the cleaning solution is applied to the wafer. Ultrasonic oscillation may be applied to the cleaning solution on the wafer.

Although the single wafer rapid cleaning apparatus is more effective at cleaning the wafer than the batch cleaning apparatus, the cleaning time of the single wafer rapid cleaning apparatus is longer than that of the batch cleaning apparatus. Unfortunately, when a plurality of wafers is simultaneously cleaned using the batch cleaning apparatus, impurities removed from the plurality of wafers may not be drained from the cleaning bath. The impurities remaining in the cleaning bath may attach to the wafer, thereby reducing the effectiveness of the cleaning process. In addition, the batch cleaning apparatus may not remove the impurities between the minute patterns formed on the wafer.

One single wafer rapid cleaning apparatus that cleans wafers by applying megasonic energy to a cleaning fluid provided on the wafers is disclosed in U.S. Pat. No. 6,039,059 ("Bran"). The cleaning apparatus in Bran includes an elongated quartz probe for applying megasonic energy to the cleaning fluid. U.S. Laid Open Patent Publication No. 2001-32657 also discloses a megasonic treating apparatus having a megasonic transformer for applying mechanical oscillation to a cleaning solution or an etching solution provided on a wafer.

Figure 1:
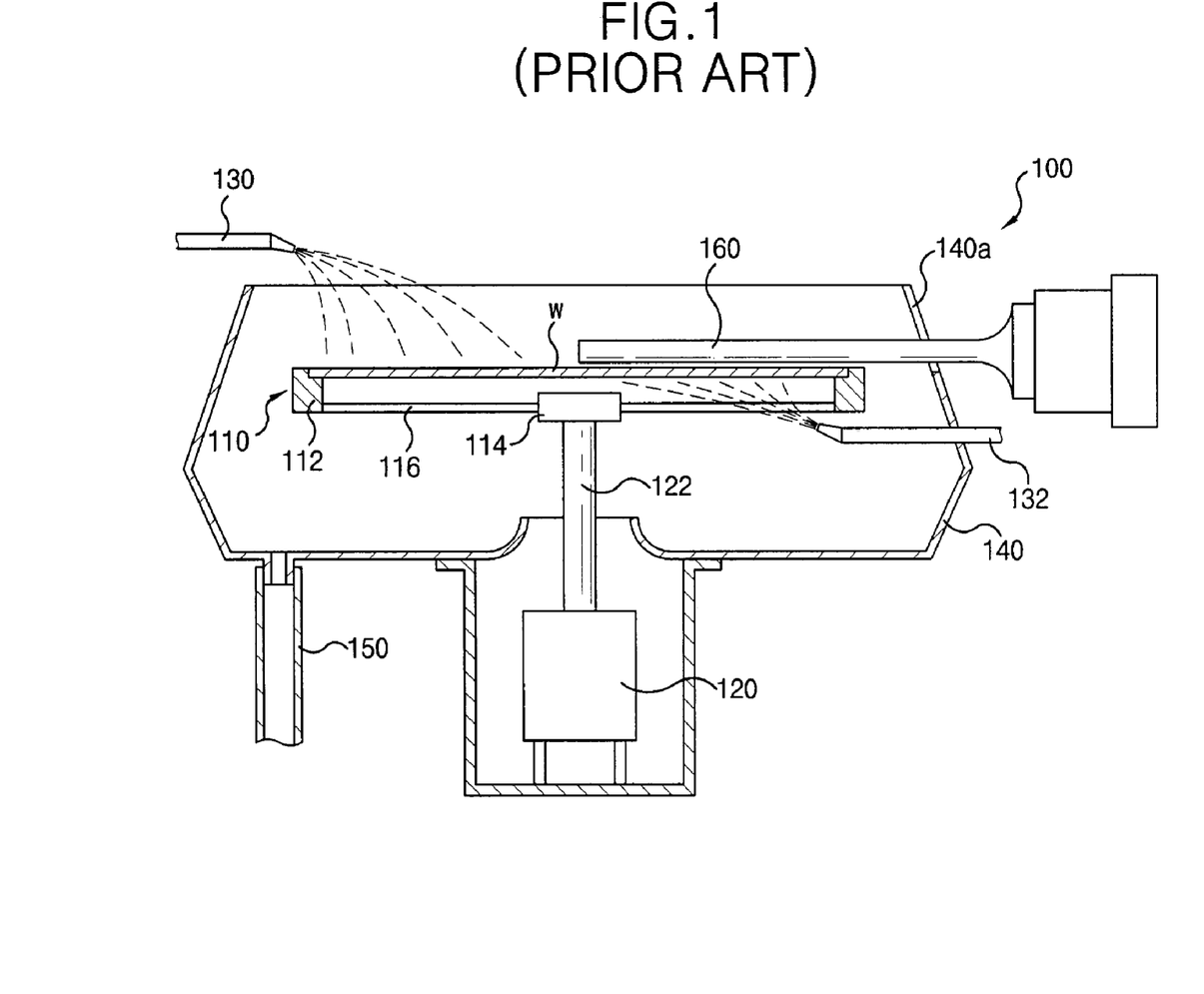
FIG. 1 is a schematic cross-sectional view illustrating a conventional single wafer rapid cleaning apparatus.

FIG. 1 is a cross-sectional view of a conventional single wafer rapid cleaning apparatus 100 having a quartz probe 160. Referring to FIG. 1, a wafer W is disposed on a round chuck 110, and a motor 120 rotates the chuck 110. The chuck 110 includes a circular ring 112 for supporting the wafer W, a hub 114 disposed on the upper face of a rotation shaft 122, and a plurality of spokes 116 connecting the circular ring 112 to the hub 114.

A first nozzle 130 is provided over the wafer W. The first nozzle 130 applies a cleaning solution to the wafer W. A bowl 140 encloses the chuck 110 to contain the cleaning solution that is scattered from the wafer W toward a peripheral region due to the rotation of the wafer W. A draining pipe 150 is connected to the bottom of the bowl 140 to drain the cleaning solution. A rotating shaft 122 extends through a central portion of the bottom of the bowl 140 to transfer the rotation force of the motor 120 to the chuck 110.

A quartz probe 160 having an elongated rod shape is disposed over the wafer W through a slot 140a formed in the bowl 140. The quartz probe 160 applies an ultrasonic oscillation to the cleaning solution provided on the wafer W. The quartz probe 160 extends parallel to the wafer W from the peripheral portion of the wafer W to the central portion of the wafer W, and is separated from the wafer W by a predetermined distance. In addition, a second nozzle 132 is installed through another portion of the bowl 140 to provide the bottom face of the wafer W on the chuck 110 with the cleaning solution.

In a cleaning process, after a wafer W is loaded onto the chuck 110, the motor 120 rotates the chuck 110 and the wafer W loaded thereon. A cleaning solution is provided onto the wafer W through the first and the second nozzles 130, 132. Rotation of the wafer W causes the cleaning solution provided onto the wafer W to be dispersed between the quartz probe 160 and the upper face of the wafer W. The quartz probe 160 applies ultrasonic oscillation to the cleaning solution located between the quartz probe 160 and the wafer W. Ultrasonic oscillation of the cleaning solution removes the minute particles attached to the wafer W. Chemicals can then be provided to the wafer W to remove any undesired film or impurities on the wafer W. Ultrasonic oscillation accelerates the chemical reaction with the undesired film or the impurities on the wafer W to increase the speed and effectiveness of their removal. Rotation of the wafer W also causes the cleaning solution to flow from the upper and lower faces of the wafer W. The cleaning solution is thereby transferred to the bottom of the bowl 140. The cleaning solution is then drained through the draining pipe 150 connected to the bottom portion of the bowl 140.

Unfortunately, the elongated rod-shaped quartz probes 160 of the apparatus 100 are frequently broken due to the ultrasonic oscillation. These quartz probes 160 therefore should not be lengthened beyond a certain length, and as a result, cannot be used effectively for large wafers. In addition, the amount of ultrasonic oscillation provided by the quartz probe 160 varies depending on the flow rate of the cleaning solution and the rotation speed of the wafer W. The ultrasonic oscillation may therefore not be uniformly applied to the cleaning solution provided on the wafer. The effectiveness of the cleaning process may therefore be different on different portions of the wafer W.

Furthermore, because the contacting area between the quartz probe 160 and the cleaning solution provided on the wafer W is limited, the effect of the ultrasonic oscillation may be reduced. Also, the minute patterns formed on the wafer W may be damaged due to the ultrasonic oscillation applied directly to the cleaning solution on the wafer W.

SUMMARY OF THE INVENTION

One object of the present invention is to provide an apparatus for treating a wafer, which can uniformly supply a cleaning solution, which an ultrasonic oscillation is applied thereto, to a surface of the wafer.

Another object of the present invention is to provide an apparatus for simultaneously treating a plurality of wafers, which can uniformly supply a cleaning solution, which an ultrasonic oscillation is applied thereto, to surfaces of the wafers, respectively.

According to one embodiment, an apparatus for treating a wafer comprises a rotating chuck for supporting and rotating the wafer. A treating fluid supplying part is disposed over the rotating chuck and includes a first receiving portion that receives a first treating fluid, and a first slit connected to the first receiving portion. The first treating fluid is uniformly applied to a surface of the rotating wafer through the first slit. An ultrasonic oscillating part is preferably installed in the first receiving portion and configured to apply ultrasonic oscillation to the first treating fluid received in the first receiving portion.

According to another embodiment, an apparatus for simultaneously treating a plurality of wafers preferably comprises a cassette stage for supporting a wafer cassette that houses a plurality of wafers. A plurality of treating chambers can also be provided. Each of the chambers preferably includes a rotating chuck, a treating fluid supplying part, and an ultrasonic oscillating part. The rotating chuck supports and rotates one of the plurality of wafers. The treating fluid supplying part is disposed over the rotating chuck and includes a first receiving portion for receiving a first treating fluid and a first slit connected to the first receiving portion. The first treating fluid is uniformly applied to surfaces of the rotating wafers through the first slits. The ultrasonic oscillating part is installed in the first receiving portion and applies ultrasonic oscillation to the first treating fluid received in the first receiving portion. A transferring part is disposed between the wafer cassette and the treating chambers for transferring the wafers to and from the chambers.

According to various principles of the present invention, a treating fluid for applying ultrasonic oscillation can be applied uniformly onto a wafer being rotated by a rotating chuck. The cleaning process can thereby be uniformly performed on the wafer. In addition, the time required for the cleaning process can be shortened without sacrificing effectiveness by performing multiple single wafer rapid cleaning processes simultaneously on a plurality of wafers.

BRIEF DESCRIPTION OF THE DRAWINGS

The above and other objects and advantages of the present invention will become more readily apparent through the following description of exemplary embodiments thereof, made with reference to the accompanying drawings, in which.

DESCRIPTION OF PREFERRED EMBODIMENTS

Various embodiments of the present invention will now be described in detail with reference to the accompanying drawings. It should be noted, however, that the following embodiments are provided by way of example and not of limitation. Various modifications and alterations to the described embodiments will be readily apparent to those of ordinary skill in the art and are therefore considered within the scope of the present invention.

Figure 2:
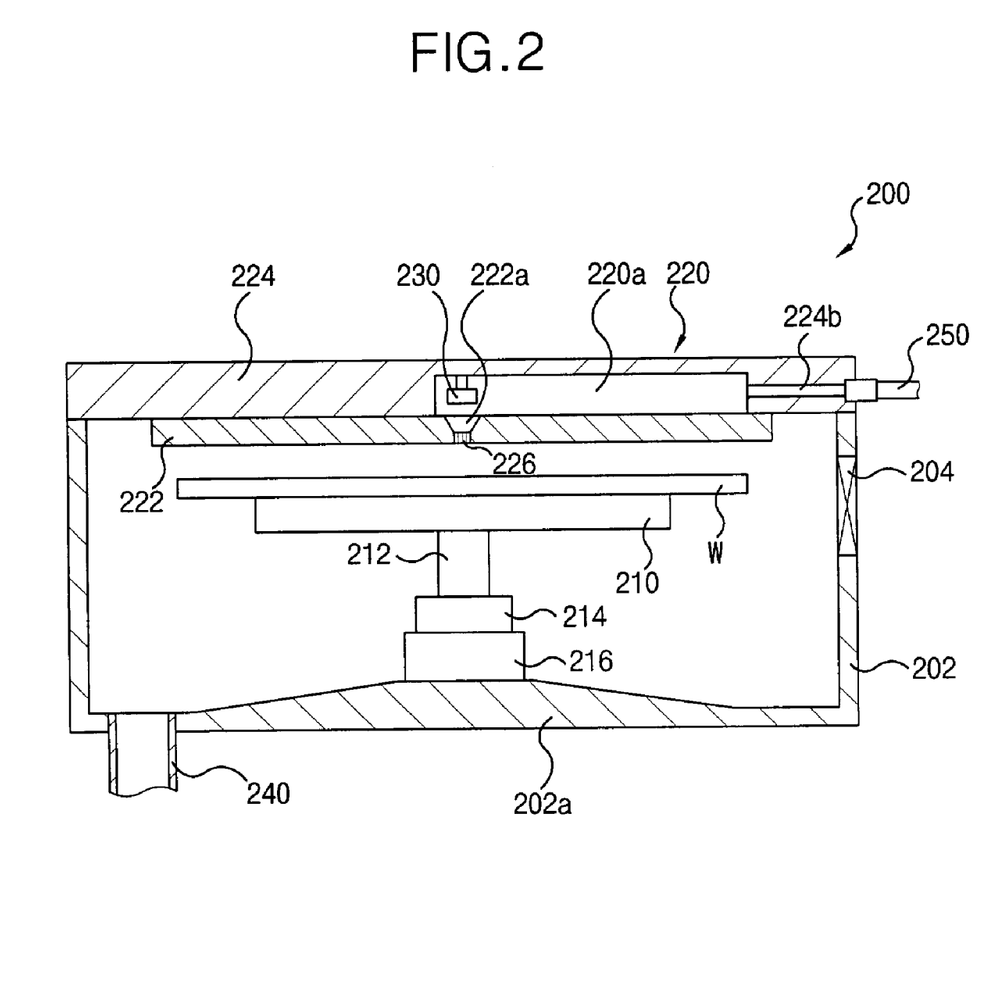
FIG. 2 is a schematic cross-sectional view illustrating an apparatus for treating a wafer according an embodiment of the present invention.

FIG. 2 is a schematic cross-sectional view of an apparatus 200 for treating a wafer W according to one embodiment of the present invention. Referring to FIG. 2, a wafer treating apparatus 200 has a rotating chuck 210, a treating fluid supplying part 220, an ultrasonic oscillating part 230, and a treating chamber 202. The rotating chuck 210 supports and rotates the wafer W. The rotating chuck 210 can hold the wafer W using any one or more of various methods well known in the art, and a description of the methods for holding the wafer W on the rotating chuck 210 will therefore be omitted. The rotating chuck 210 is installed in the treating chamber 202. The treating chamber 202 preferably has a cup or bowl shape with an open upper portion.

The treating fluid supplying part 220 is disposed over the rotating chuck 210 and supplies a treating fluid to the wafer W supported by the rotating chuck 210. The treating fluid can be a cleaning solution for cleaning the wafer W, and can include various cleaning solutions known to those skilled in the art. A receiving portion 220a is provided in the treating fluid supplying part 220 to receive the treating fluid, and a slit 222a communicates with the receiving portion 220a to supply the treating fluid to the wafer W. The ultrasonic oscillating part 230 is disposed in the receiving portion 220a and applies ultrasonic oscillation to the treating fluid received in the receiving portion 220a.

The treating fluid supplying part 220 of this embodiment preferably has a disc shape, and is sized to cover the upper portion of the treating chamber 202. A rotating shaft 212 is coupled between a bottom face of the rotating chuck 210 and a motor 214 to provide a rotational force from the motor 214 to the chuck 210. A driving part 216 can be installed beneath the motor 214 to adjust the space between the treating fluid supplying part 220 and the wafer W supported by the rotating chuck 210. More specifically, the driving part 216 moves the motor 214 upward or downward to adjust the spacing between the treating fluid supplying part 220 and the wafer W. The driving part 216 is preferably mounted on a central portion of the bottom 202a of the treating chamber 202.

A draining pipe 240 is also preferably connected to the bottom 202a of the treating chamber 202 to drain the treating fluid used for cleaning the wafer W. The bottom 202a of the treating chamber 202 is preferably shaped having a raised central portion and a peripheral portion that slopes gradually downward from the raised central portion. A door 204 is preferably arranged in a lateral wall of the treating chamber 202 for loading the wafer W onto, and unloading the wafer W from, the rotating chuck 210.

An ultrasonic oscillation generation member (not shown) preferably includes an ultrasonic generator and a megasonic generator. The ultrasonic generator preferably provides radio frequency power of approximately 20 to 800 kHz, and the megasonic generator preferably provides radio frequency power greater than approximately 800 kHz. The ultrasonic oscillating part 230 can be a piezoelectric transformer that generates mechanical oscillation using the radio frequency power provided from the ultrasonic oscillation generation member.

Figure 3:
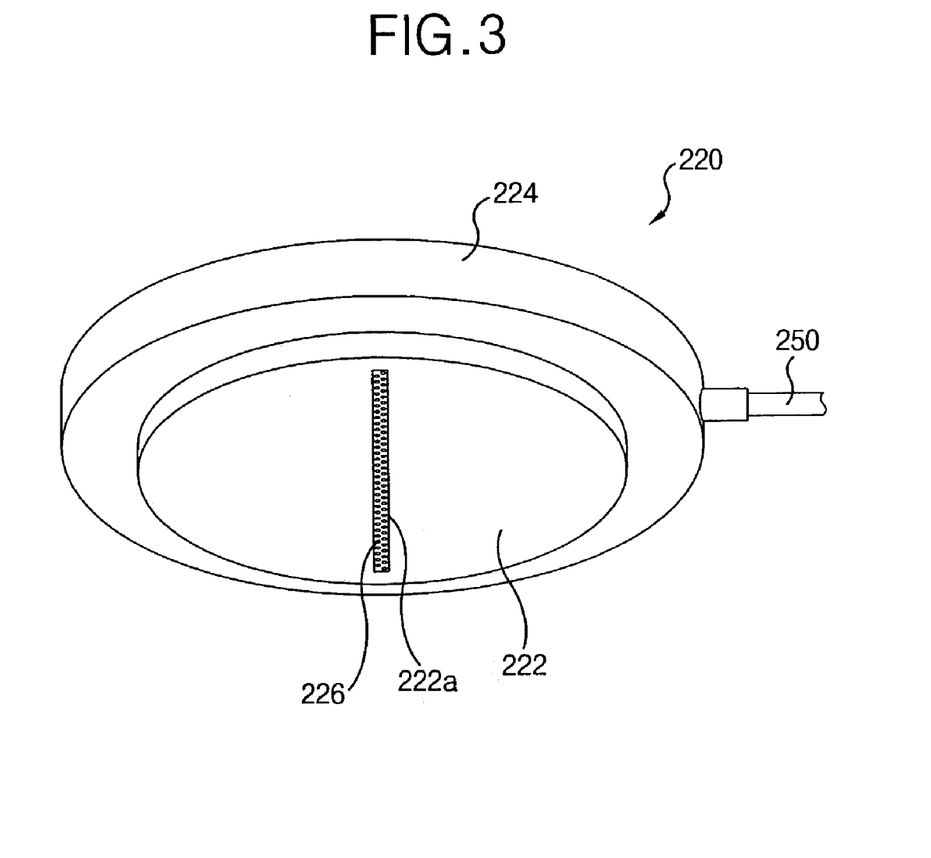
FIG. 3 is a perspective view of a treating fluid supplying part of the wafer treating apparatus of FIG. 2.

FIG. 3 is a perspective view showing the treating fluid supplying part 220 of the wafer treating apparatus of FIG. 2. Referring to FIG. 3, the treating fluid supplying part 220 has a first plate 222 and a second plate 224. The first plate 222 and the second plate 224 are each disc-shaped. The first plate 222 is preferably larger than the wafer W, and the second plate 224 is preferably sized to cover the upper portion of the treating chamber 202. The first plate 222 is attached to the second plate 224 such that central axes of the first plate 222 and the second plate 224 are aligned.

Figure 4:
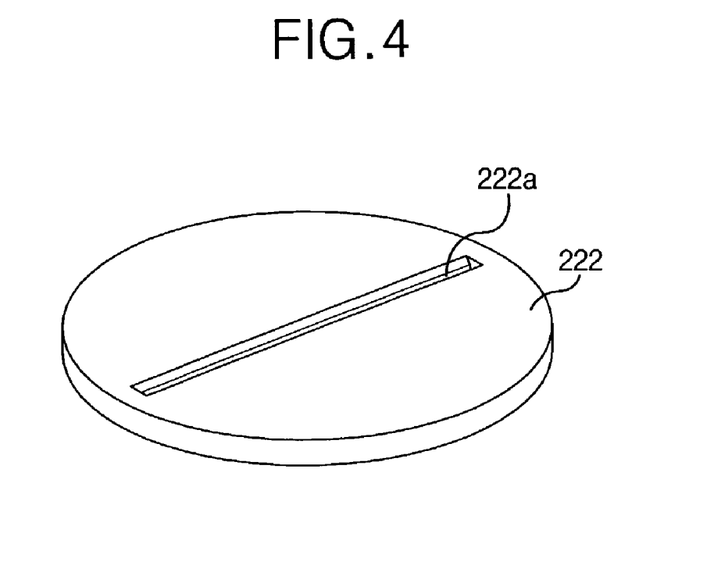
FIG. 4 is a perspective view of a first plate of the treating fluid supplying part of FIG. 3.
Figure 5:
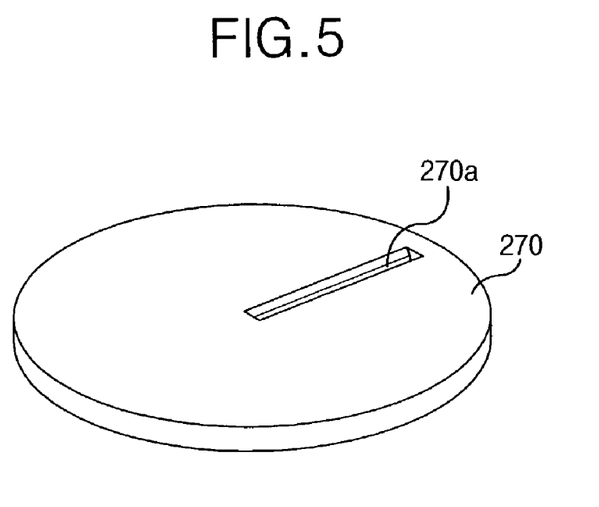
FIG. 5 is a perspective view of another embodiment of the first plate of the treating fluid supplying part of FIG. 3.

FIGS. 4 and 5 are perspective views of alternative embodiments of the first plate 222 of the fluid supplying part 220 of FIG. 3. Referring to FIG. 4, the slit 222a of the first plate 222 is preferably formed to extend through the center of the first plate 222. The length of the slit 222a is preferably substantially equal to a diameter of the wafer W. However, referring to FIG. 5, in an alternative embodiment, the slit 270a can be formed to extend from the center of the first plate 270 to the peripheral portion of the first plate 270. In this embodiment, the length of the slit 270a in FIG. 5 is substantially equal to a radius of the wafer W. Referring to FIGS. 4 and 5, in operation, the treating fluid is applied to the wafer W through the slit 222a, 270a. Rotation of the wafer W allows the treating fluid to be supplied to the entire surface of the wafer W.

Figure 6:
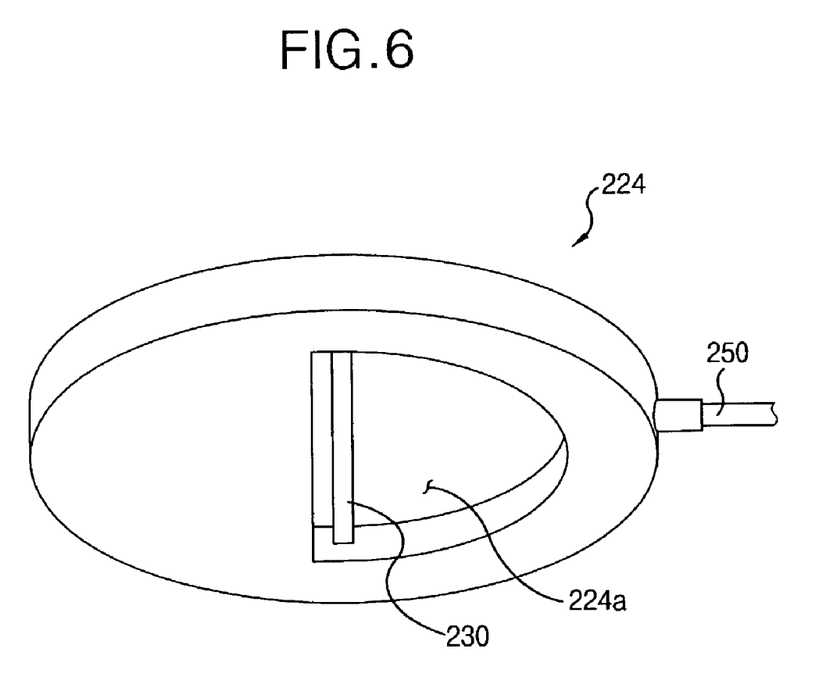
FIG. 6 is a perspective view of a second plate of the treating fluid supplying part of FIG. 3.
Figure 7:
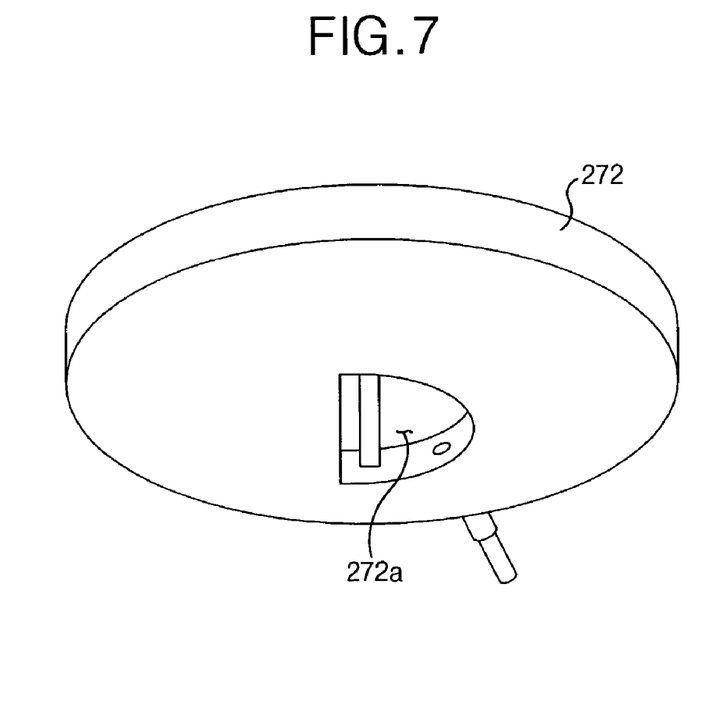
FIG. 7 is a perspective view of another embodiment of the second plate of the treating fluid supplying part of FIG. 3.

FIGS. 6 and 7 are perspective views of various embodiments of the second plate 224 of the fluid supplying part 220 of FIG. 3. Referring to FIG. 6, in one embodiment, a recess 224a having a semicircular shape is formed on the bottom face of the second plate 224 for receiving the treating fluid. The recess 224a is preferably arranged in communication with the slit 222a of the first plate 222 (see FIG. 3). The diameter of the recess 224a preferably corresponds to the length of the slit 222a formed on the first plate 222. A supplying pipe 250 is preferably connected to a lateral portion of the second plate 224. The supplying pipe 250 can be inserted into a hole 224b (see FIG. 2) that extends through the lateral portion of the second plate 224 to the recess 224a. The ultrasonic oscillating part 230 is preferably disposed in the recess 224a in a position that corresponds to the slit 222a of the first plate 222 to apply ultrasonic oscillation to the treating fluid.

Referring to FIG. 7, in one alternative embodiment 272 of the second plate 224, the diameter of a recess 272a of the second plate 272 corresponds to the radius of the wafer W. This embodiment can be employed, for example, in combination with the embodiment of the first plate 270 of FIG. 5. The shape of the recess 272a can be formed in any desired manner.

Referring back to FIG. 2, the receiving portion 220a is defined by the first plate 222 and the recess 224a of the second plate 224. The ultrasonic oscillating part 230 installed in the recess 224a preferably applies ultrasonic oscillation to the treating fluid received in the receiving portion 220a, and the treating fluid applying the ultrasonic oscillation is provided onto the wafer W. In this manner, damage to the pattern formed on the wafer W can be significantly reduced.

Figure 8:
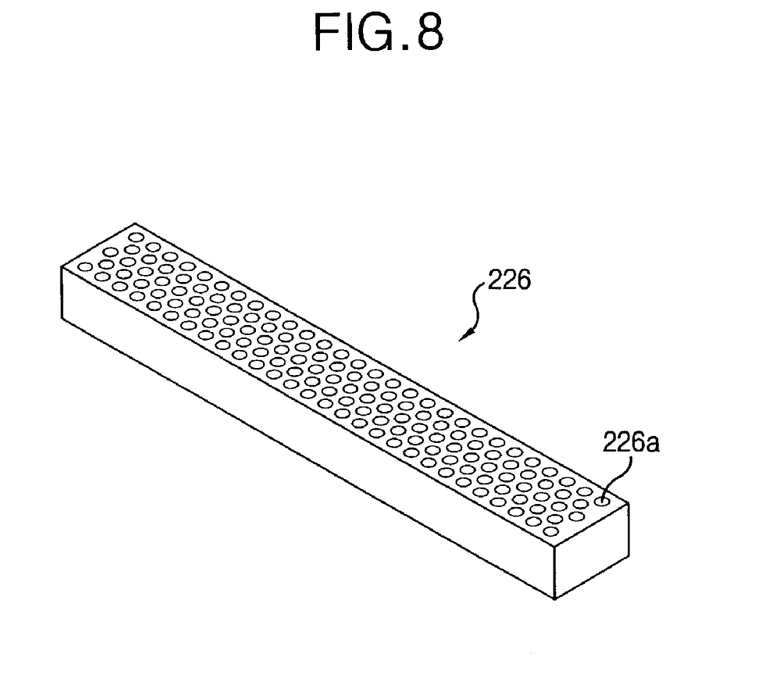
FIG. 8 is a perspective view of a spraying plate of the treating fluid supplying part of FIG. 3.

FIG. 8 is a perspective view of a spraying plate 226 of the fluid supplying part 220 of FIG. 3. Referring to FIGS. 3 and 8, the spraying plate 226 is installed in the slit 222a of the first plate 222 of the fluid supplying part 220. A plurality of spraying holes 226a are formed in the spraying plate 226 for uniformly supplying the treating fluid to the wafer W. Rotation of the wafer W further allows the treating fluid applying the ultrasonic oscillation to be uniformly supplied to the wafer W from the spray holes 226a of the spraying plate 226.

The treating fluid preferably includes a cleaning solution for cleaning the surface of the wafer W. The cleaning solution can be any suitable solution, such as those known to those skilled in the art. Examples of possible cleaning solutions include de-ionized water; a mixture (DHF) of de-ionized water and hydro fluoric acid (HF); a mixture of ammonium hydroxide ($NH_4OH$), hydrogen peroxide ($H_2O_2$) and de-ionized water; a mixture of ammonium fluoride ($NH_4F$), hydro fluoric acid, and de-ionized water; or a mixture of phosphoric acid ($H_3PO_4$) and de-ionized water.

In general, de-ionized water can be used for removing impurities attached to the wafer W and for rinsing the wafer W. The mixture (DHF) of de-ionized water and hydro fluoric acid can be used to remove naturally formed oxide film (such as a silicon oxide ($SIO_2$) film) from the wafer W. DHF can also be used for removing metal ions on the wafer W. A mixing ratio between de-ionized water and hydro fluoric acid for this application is preferably between about 1:100 to 1:500. The mixing ratio can be varied, however, depending on the needs of a particular cleaning process.

The mixture of ammonium hydroxide, hydrogen peroxide, and de-ionized water (called a SC1 solution) can be used to remove oxide film formed on the wafer W or organic materials attached to the wafer W. The mixing ratio of ammonium hydroxide, hydrogen peroxide, and de-ionized water is preferably between approximately about 1:4:20 to 1:4:100. The mixing ratio of the SC1 solution can be varied in accordance with the conditions of the cleaning process. The mixture of ammonium fluoride, hydro fluoric acid, and de-ionized water (called a LAL solution) can also remove the oxide film formed on the wafer W. Finally, the mixture of phosphoric acid and de-ionized water can remove nitride-based impurities that are difficult to remove using the LAL solution.

The aforementioned cleaning solutions may have improved cleaning efficiencies in higher temperature cleaning processes. The cleaning temperature can therefore preferably be adjusted based on the cleaning solutions used. Additionally, various cleaning solutions can be sequentially employed in the cleaning process. Ultrasonic oscillation accelerates the reaction between the cleaning solution and the wafer, thereby improving the cleaning efficiency of the cleaning process for the wafer.

The treating fluid also preferably includes a drying gas for drying the surface of the wafer. The drying gas can, for instance, include a vapor of isopropyl alcohol, a heated nitrogen gas, or a mixture of isopropyl alcohol vapor and heated nitrogen gas. The moisture remaining on the surface of the wafer is removed according to the Marangoni Effect caused by the isopropyl alcohol vapor applied to the wafer, and the rotation of the wafer.

The vapor of isopropyl alcohol can be formed by heating a liquid isopropyl alcohol, or it can be formed using a bubbler that generates the vapor of isopropyl alcohol that is combined with the heated nitrogen gas. When the isopropyl alcohol vapor is formed with the bubbler, the heated nitrogen gas is used as a carrier gas, and the mixture of the isopropyl alcohol vapor and the heated nitrogen gas is supplied onto the wafer. The heated nitrogen gas can only be employed for finally drying the wafer.

If isopropyl alcohol vapor is independently provided to the surface of the wafer, the moisture on the wafer is removed using the isopropyl alcohol vapor, and heated nitrogen gas is then repeatedly provided to the surface of the wafer. The isopropyl alcohol remaining on the surface of the wafer is volatized and the wafer is finally dried. When the isopropyl alcohol vapor and heated nitrogen gas mixture is provided to the wafer, removal of the moisture from the surface of the wafer and volatilization of the isopropyl alcohol vapor are simultaneously accomplished.

Figure 9:
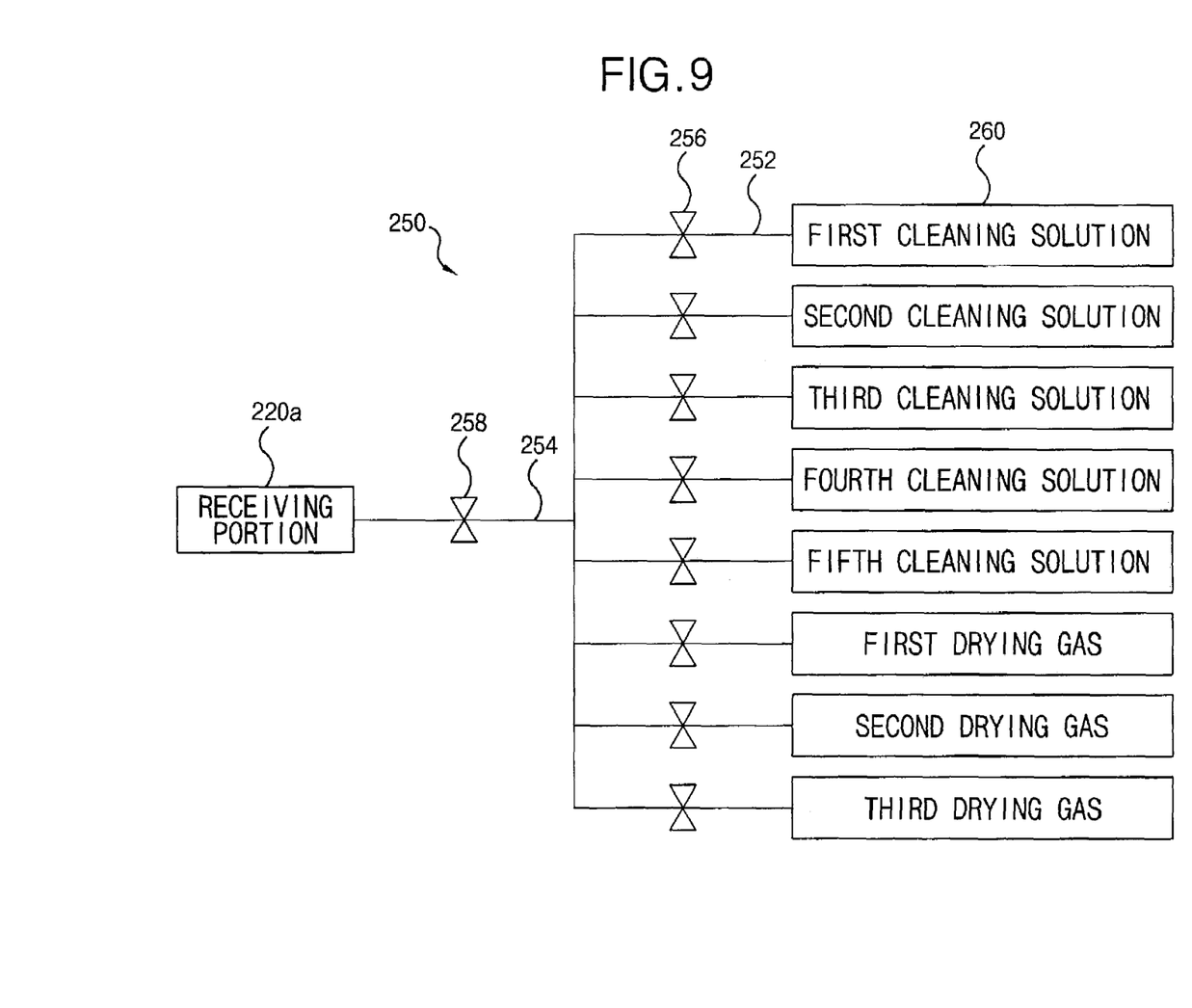
FIG. 9 is a block diagram representing a supply pipe connected to a treating fluid supplying part of the wafer treating apparatus of FIG. 2.

FIG. 9 is a block diagram illustrating a supply pipe 250 connected to the treating fluid supplying part 220 of the wafer treating apparatus 200 of FIG. 2. Referring to FIGS. 2 and 9, the supply pipe 250 is connected to the receiving portion 220a of the treating fluid supplying part 220. The supply pipe 250 preferably includes a plurality of first tubes 252, a second tube 254, a plurality of first valves 256, and a second valve 258. The first tubes 252 supply a plurality of different treating fluids 260 to the receiving portion 220a. The first valves 256 are arranged in the first tubes 256 to control the flow rates of the different treating fluids to the second tube 254, respectively. The second tube 254 connects the first tubes 252 to the receiving portion 220a, and supplies the receiving portion 220a with a treating fluid selected from the different treating fluids. The second valve 258 is installed in the second tube 254 and controls the flow rate of the selected treating fluid to the receiving portion 220a.

In this embodiment, the treating fluids include first through fifth cleaning solutions, and first through third drying gases. The first tubes 252 can preferably be configured to selectively supply the receiving portion 220a with de-ionized water, the mixture of hydro fluoric acid and de-ionized water, the mixture of ammonium hydroxide, hydrogen peroxide and de-ionized water, the mixture of ammonium fluoride, hydro fluoric acid and de-ionized water, the mixture of phosphoric acid and de-ionized water, the isopropyl alcohol vapor, or the heated nitrogen gas.

Together, the first valves 256 of the first tubes 252 and the second valve 258 of the second tube 254 operate to select the cleaning solution and the drying gas demanded for cleaning and drying the wafer W. That is, a cleaning process is performed for the wafer W using the cleaning solution selected by the first and second valves 256, 258 based on the impurities to be removed. Following this, the wafer W is cleaned with de-ionized water. After the wafer W has been cleaned using de-ionized water, a drying process is performed using drying gas to dry the wafer W.

Figure 10:
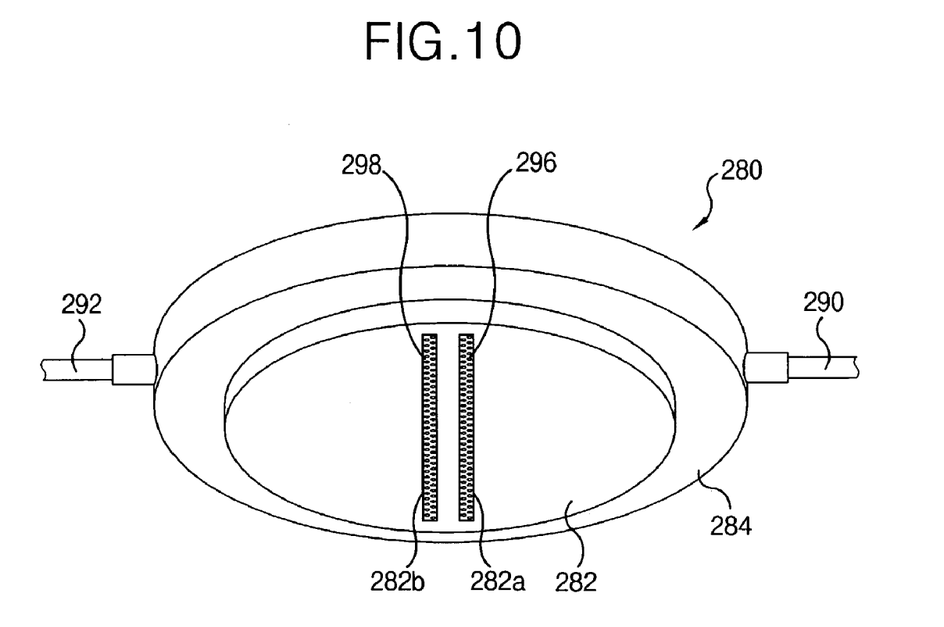
FIG. 10 is a perspective view of another embodiment of a treating fluid supplying part of the wafer treating apparatus of FIG. 2.
Figure 11:
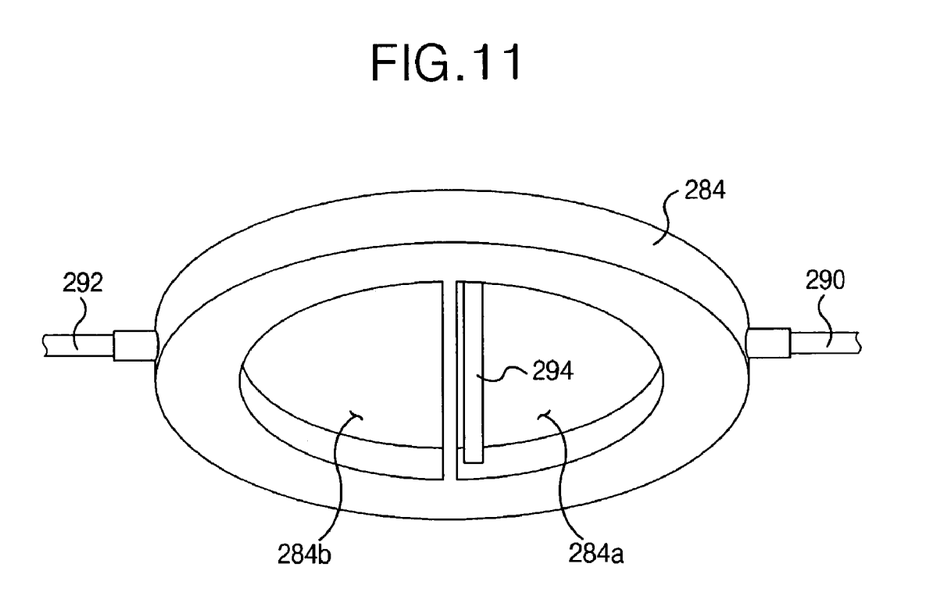
FIG. 11 is a perspective view of a second plate of the treating fluid supplying part of FIG. 10.

Unfortunately, the cleaning solution and the drying gas remaining in the second tube 256 and the receiving portion 220a should be exhausted between the cleaning process and the drying process because the phase of the cleaning solution is different that of the drying gas. This increases the complexity of the cleaning and drying processes. FIGS. 10 and 11 illustrate a fluid supplying part 280 according to another potential embodiment of the present invention that can help to overcome this problem.

More particularly, FIG. 10 is a perspective view of a fluid supplying part 280 according to another embodiment of the treating fluid supplying part 220 of the wafer treating apparatus of FIG. 2. FIG. 11 is a perspective view of a second plate 284 of the fluid supplying part 280 of FIG. 10. Referring to FIGS. 10 and 11, a treating fluid supplying part 280 includes a first plate 282 and a second plate 284. The first and the second plates 282, 284 are preferably disc-shaped. The first plate 282 is larger than the wafer W (see FIG. 2). The second plate 284 is sized to cover the upper portion of the treating chamber 202. The first plate 282 is preferably attached to a bottom of the second plate 284 such that the central axis of the first plate 282 is aligned with that of the second plate 284.

A first slit 282a and a second slit 282b are preferably formed in the first plate 282 to respectively apply a first treating fluid and a second treating fluid to the surface of the wafer W. The first and the second slits 282a, 282b are preferably arranged parallel to each other on opposite sides of a center of the first plate 282. The lengths of the first and the second slits 282a, 282b are preferably approximately equal to the diameter of the wafer W.

A first recess 284a and a second recess 284b are preferably formed in the bottom face of the second plate 284. The first and second recesses 284a, 284b correspond to the first and second slits 282a, 282b, respectively. The first and second recesses 284a, 284b each have a semicircular shape. Preferably, the straight-line portions of the semicircular recesses 284a, 284b are arranged parallel to the first and second slits 282a, 282b. A first receiving portion for receiving the first treating fluid is thereby defined by the first plate 282 and the first recess 284a. A second receiving portion for receiving the second treating fluid is defined by the first plate 282 and the second recess 284b.

A first supply pipe 290 preferably communicates with the first recess 284a to supply the first receiving portion with the first treating fluid. A second supply pipe 292 preferably communicates with the second recess 284b to supply the second receiving portion with the second treating fluid. The first treating fluid can be a cleaning solution for cleaning the wafer W. In this case, an ultrasonic oscillating part 294 is disposed in the first recess 284a to apply ultrasonic oscillation to the first treating fluid. The second treating fluid can be a drying gas for drying the wafer W.

A first spraying plate 296 and a second spraying plate 298 are installed in the first slit 282a and the second slit 282b, respectively. The first and second spraying plates 296, 298 uniformly apply the first and the second treating fluids, respectively, to the rotating wafer W. In this embodiment, the cleaning and the drying processes can be accomplished more easily than when using the treating fluid supplying part 220 of FIG. 3. This is because in the treating fluid applying part 280 of FIGS. 10 and 11 the first and second treating fluids are provided independently and the treating fluids therefore do not need to be purged between processes.

Figure 12:
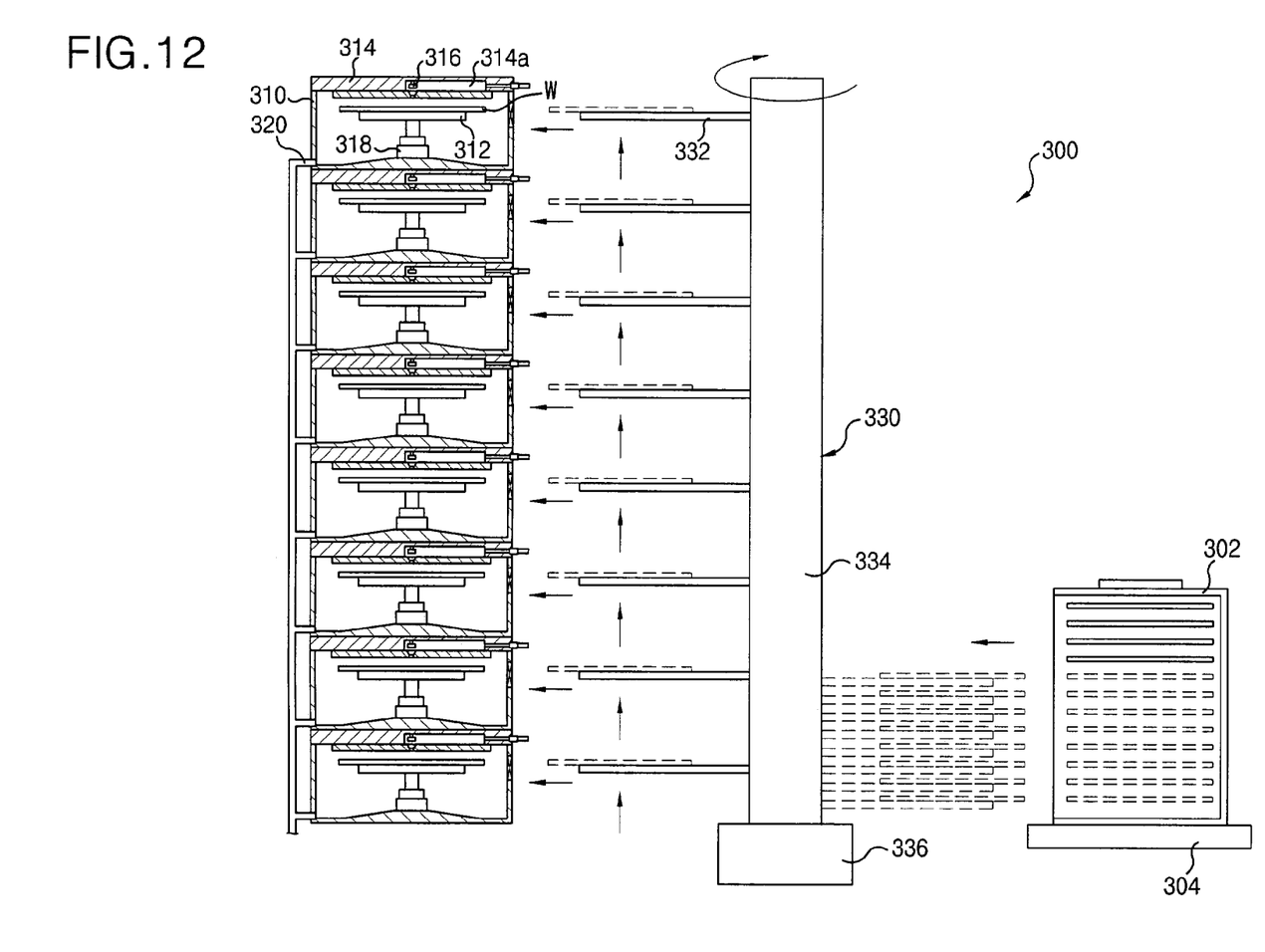
FIG. 12 is a schematic cross-sectional view of a wafer treating apparatus according to another embodiment of the present invention.

FIG. 12 is a schematic cross-sectional view of an apparatus 300 for simultaneously treating a plurality of wafers according to another embodiment of the present invention. Referring to FIG. 12, a wafer treating apparatus 300 according to this embodiment preferably includes a cassette stage 304, a plurality of treating chambers 310, and a transferring part 330. The cassette stage 304 supports a wafer cassette 302 which receives a plurality of wafers W. The transferring part 330 is disposed between the cassette stage 304 and the treating chambers 310 to transfer the wafers W from the wafer cassette 302 to the treating chambers 310. Each of the treating chambers 310 treats a corresponding one of the wafers W received therein.

Each treating chamber 310 includes a rotating chuck 312, a treating fluid supplying part 314, and an ultrasonic oscillating part 316. The rotating chuck 312 supports and rotates the wafer W. The treating fluid supplying part 314 supplies a treating fluid for cleaning the wafer W onto the wafer W. The ultrasonic oscillating part 316 applies ultrasonic oscillation to the treating fluid received in the treating fluid supplying part 314. A first driving part 318 is further installed in each treating chamber 310 to provide the rotating chuck 312 with a rotation force, and to adjust the separation distance between the wafer W and the treating fluid supplying part 314.

The overall construction of the treating chamber 310 in this embodiment is similar to that of the treating chamber 202 of the first embodiment as shown in FIG. 2. The rotating chuck 312, the treating fluid supplying part 314 having the receiving portion 314a, and the ultrasonic oscillating part 316 can each have the same structure as the corresponding components of the wafer treating apparatus 200 of FIG. 2. A repeated description of those elements will therefore be omitted.

The treating chambers 310 are preferably stacked vertically. Draining pipes 320 are preferably respectively connected to a lower portion of a corresponding one of the treating chambers 310 to drain the treating fluids used for cleaning the wafers W. In operation, the transferring part 330 can extract several wafers W from the wafer cassette 302 and then simultaneously load the wafers W into the treating chambers 310.

More specifically, the transferring part 330 preferably includes a driving shaft 334 arranged vertically in the wafer treating apparatus 300 and a plurality of robot arms 332 extending horizontally from the driving shaft 334. The robot arms 332 can move between the wafer cassette 302 and the treating chambers 310 to simultaneously load multiple wafers W into the treating chambers 310 and to simultaneously unload the wafers W from the treating chambers 310. The robot arms 332 move reciprocally in the horizontal direction to load the wafers W into the treating chambers 310 and to unload the wafers W from the treating chambers 310.

A second driving part 336 is preferably disposed beneath the driving shaft 334. The second driving part 336 can be configured to rotate the robot arms 332 and to move the robot arms 332 vertically up and down. The second driving part 336 rotates the robot arms 332 to position the arms to communicate with either the wafer cassette 302 or the treating chambers 310. The second driving part 336 moves the robot arms 332 vertically up and down to align the heights of the robot arms 332 with the heights of the slots of either the wafer cassette 302 or the heights of the treating chambers 310.

According to this embodiment, therefore, a wafer treating apparatus 300 can treat a plurality of wafers W simultaneously, and the processing time required to treat the wafers W can thereby be greatly reduced. In addition, the effectiveness of the treating process can be improved because the treating process for each wafer can be independently performed.

Although the treating chambers 310 of the wafer treating apparatus 300 shown in FIG. 12 are stacked vertically, numerous other configurations are possible. The treating chambers 310, for example, can be arranged next to each other in a horizontal line or can be both lined up horizontally and stacked vertically. In the embodiment in which the chambers 310 are both stacked vertically and lined up horizontally, a plurality of wafer cassettes 302 in a cassette stage 304 can be provided. Each of the wafer cassettes 302 can be disposed in a horizontal position corresponding to one of the horizontally arranged treating chambers 310. A plurality of transferring parts 330 can similarly be disposed between the cassette stage 304 and the treating chambers 310.

Figure 13:
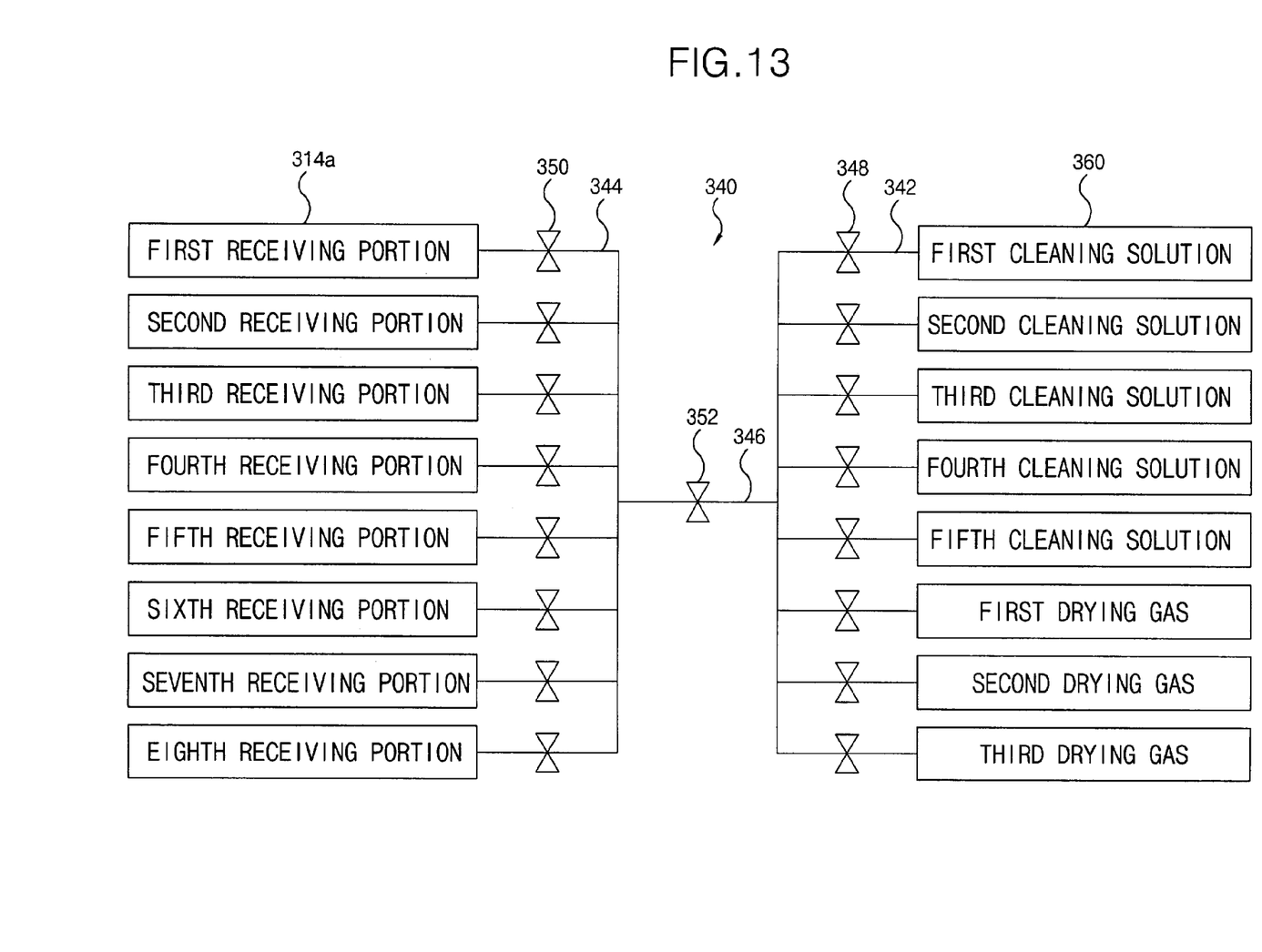
FIG. 13 is a block diagram representing supplying pipes connected to treating fluid supplying parts of the wafer treating apparatus of FIG. 12.

FIG. 13 is a block diagram representing a supply pipe system 340 connected to receiving portions 314a of the treating fluid supplying parts 314 of the wafer treating apparatus of FIG. 12. Referring to FIGS. 12 and 13, the supply pipe system 340 connected to the treating fluid supplying parts 314 includes a plurality of first tubes 342, a plurality of second tubes 344, a third tube 346, a plurality of first valves 348, a plurality of second valves 350, and a third valve 352.

The first tubes 342 supply a plurality of different treating fluids 360 to the wafers W, and the first valves 348 are installed in the first tubes 342 to control the delivery and flow rate of corresponding treating fluids to the third tube 346. The second tubes 344 are connected to the treating fluid supplying parts 314 to supply the receiving portions 314a with a treating fluid selected from among the various treating fluids 360. The second valves 350 are installed in the second tubes 344 to control the delivery and flow rates of the treating fluids 360 to the receiving portions 314a. The third tube 346 connects the first tubes 342 to the second tubes 344, and the third valve 352 is installed in the third tube 346 to control the delivery and flow rate of the selected treating fluid to the second tubes 344. The treating fluids 360 can thereby be sequentially applied to the treating fluid supplying parts 314.

The different treating fluids can include, for example, first through fifth cleaning solutions and first through third drying gases. In one embodiment, the first tubes 342 can sequentially supply into the receiving portions 314a with de-ionized water; with a mixture of hydrofluoric acid and de-ionized water; with a mixture of ammonium hydroxide, hydrogen peroxide, and de-ionized water; with a mixture of ammonium fluoride, hydro fluoric acid, and de-ionized water; with a mixture of phosphoric acid and de-ionized water; with isopropyl alcohol vapor; and with heated nitrogen gas through the third and second tubes 346, 344.

The first valves 348 installed in the first tubes 342 select the cleaning solution or the drying gas required for cleaning or drying the wafer W, respectively. The second and third valves 350, 352 installed in the second and third tubes 344, 346, respectively, work together to control the flow rates of the selected treating fluids to the wafers W loaded in the treating chambers 310. Accordingly, the cleaning process can be performed for a wafer W using a cleaning solution selected based on the impurities to be cleaned. After appropriate cleaning solution(s) have been applied, the wafer W can be rinsed with de-ionized water. When the rinsing process is completed, the drying process for drying the wafer W can then be performed using the drying gas(es).

Figure 14:
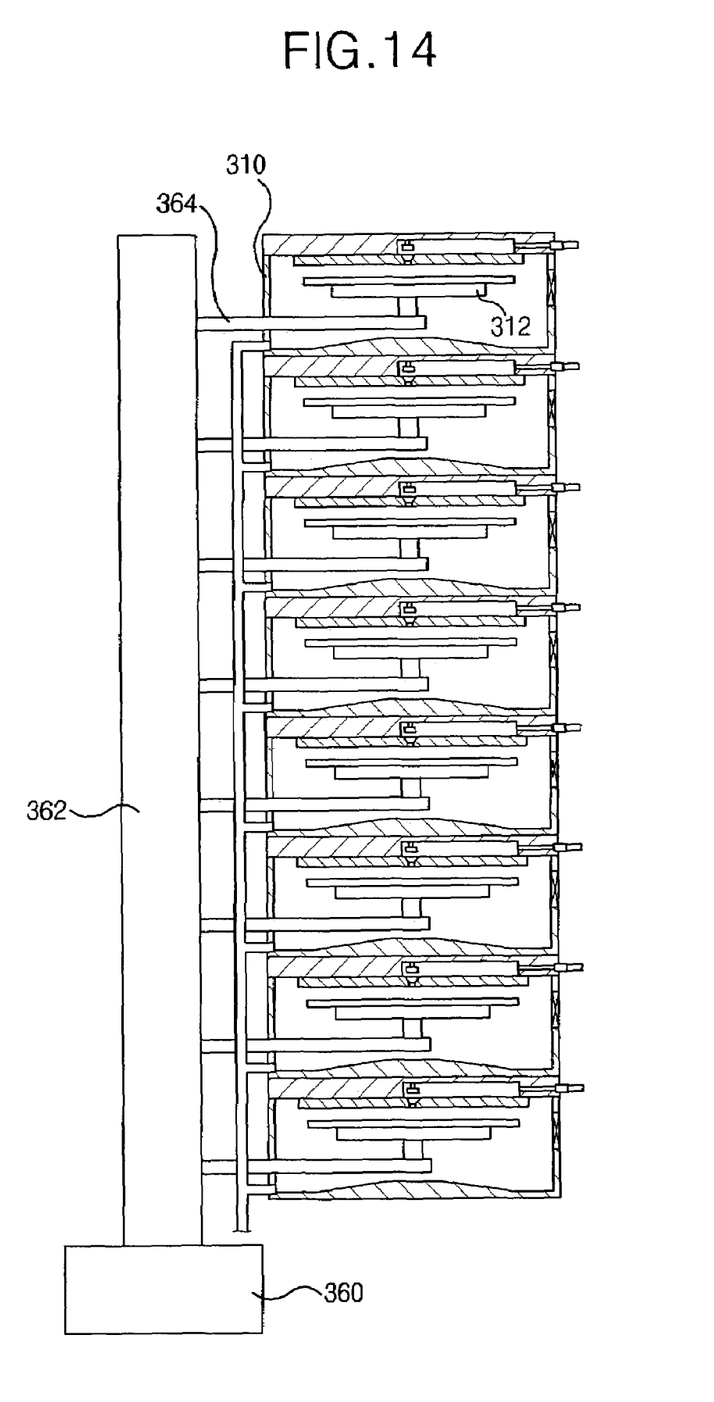
FIG. 14 is a schematic cross-sectional view illustrating an alternative embodiment of a first driving part of the wafer treating apparatus of FIG. 12.

FIG. 14 is a schematic cross-sectional view illustrating another embodiment 362 of the first driving part 318 of the wafer treating apparatus 300 shown in FIG. 12. Referring to FIG. 14, a first driving part 360 is disposed adjacent to the treating chambers 310. The first driving part 360 is connected to a plurality of rotating chucks 312 through a vertical arm 362 and a plurality of horizontal arms 364.

The vertical arm 362 is connected to an upper portion of the first driving part 360. The horizontal arms 364 pass through lateral portions of the treating chambers 310 such that the horizontal arms 364 connect the vertical arm 362 to the rotating chucks 312. In this embodiment, the first driving part 360 is configured to rotate the rotating chucks 312 provided in the treating chambers 310, and to adjust the heights of the rotating chucks 312. By arranging the first driving part 360 and the vertical arm 362 outside of the treating chambers 310, the heights of the rotating chucks 312 can be reduced, and a design specification for the wafer treating apparatus 300 can be more easily ensured.

In summary, according to certain embodiments of the present invention, a treating fluid supplying part can supply treating fluid applying ultrasonic oscillation to a rotating wafer through a slit. The treating fluid applying ultrasonic oscillation can be uniformly applied to the surface of the wafer, and the efficiency of the cleaning process for the wafer can be improved. Damage to the patterns formed on the wafer can also be reduced by cleaning the wafer with the treating fluid applying ultrasonic oscillation.

According to certain alternative embodiments, a wafer treating apparatus can include a plurality of treating chambers, and a transferring part for simultaneously transferring the wafers. The treating process can accordingly be performed simultaneously on several wafers thereby reducing the amount of time required for performing the treating process.

Having described various embodiments of the invention, it should be noted that numerous modifications and variations will be apparent to persons skilled in the art in light of the teachings herein. All such modifications and variations therefore fall within the scope and the spirit of the invention as outlined by the appended claims.

What is claimed is:

1. An apparatus for treating a wafer comprising:
   a rotating chuck that supports and rotates a wafer;
   a treating chamber, wherein the rotating chuck is arranged in the treating chamber;
   a treating fluid supplying part disposed over the rotating chuck, the treating fluid supplying part comprising:
      a first disc-shaped plate having a recess defined therein for receiving a treating fluid; and
      a second disc-shaped plate attached to the first disc-shaped plate and having a slit defined therein, the recess and the second disc-shaped plate defining a receiving portion wherein the slit is arranged in communication with the receiving portion, wherein a length of the slit is equal to or greater than a radius of the wafer; and
   an ultrasonic oscillating part disposed in the receiving portion and above the slit configured to apply ultrasonic oscillation to the treating fluid, wherein the treating fluid is applied to a treatment surface of the wafer through the slit,
   wherein an upper portion of the treating chamber is open and wherein the treating fluid supplying part covers the upper portion of the treating chamber.

2. The apparatus according to claim 1, further comprising a drain pipe connected to a bottom portion of the treating chamber to drain the treating fluid.

3. The apparatus according to claim 1, further comprising a driving part arranged to move the rotating chuck vertically up and down to adjust a separation distance between the treating fluid supplying part and the wafer supported by the rotating chuck.

4. The apparatus according to claim 1, wherein the first and second disc-shaped plates are each configured to contact the treating fluid.

5. The apparatus according to claim 4, wherein the recess of the first disc-shaped plate is configured to fill with the treating fluid.

6. The apparatus according to claim 1, wherein the ultrasonic oscillating part includes more than one side configured to contact the treating fluid.

7. The apparatus according to claim 1, wherein
   the ultrasonic oscillating part is disposed in the recess; and
   the slit is arranged in communication with the recess.

8. The apparatus according to claim 7, wherein the recess has a semicircular shape.

9. The apparatus according to claim 8, wherein a length of the ultrasonic oscillating part is substantially equal to a diameter of the semicircular shape of the recess.

10. The apparatus according to claim 8, wherein a length of slit is substantially equal to a diameter of the semicircular shape of the recess.

11. The apparatus according to claim 1, wherein the treating chamber includes sidewalls defining the upper portion thereof and wherein the treating fluid supplying part covers an upper surface of the sidewalls of the treating chamber.

12. An apparatus for treating a plurality of wafers comprising:
   a cassette stage that supports a wafer cassette capable of housing a plurality of wafers;
   a plurality of treating chambers;
   a rotating chuck within each of the plurality of treating chambers, wherein each rotating wafer is configured to support and rotate one of the plurality of wafers;
   a treating fluid supplying part disposed over each rotating chuck, each treating fluid supplying part comprising a first disc-shaped plate having a recess defined therein for receiving a treating fluid and a second disc-shaped plate attached to the first disc-shaped plate and having a slit defined therein, the recess and the second disc-shaped plate defining a receiving portion wherein the slit is arranged in communication with the receiving portion, wherein a length of the slit is equal to or greater than a radius of the wafer and wherein the treating fluid can be uniformly applied to a surface of the wafer through the slit;
   an ultrasonic oscillating part installed in each receiving portion and above the slit for applying an ultrasonic oscillation to the treating fluid; and
   a transferring part disposed between the wafer cassette and the treating chambers for transferring the wafers,
   wherein an upper portion of each treating chamber is open and wherein each treating fluid supplying part covers the upper portion of a corresponding treating chamber.

13. The apparatus according to claim 12, wherein the plurality of treating chambers are stacked vertically.

14. The apparatus according to claim 12, further comprising a driving part for moving the rotating chuck vertically to adjust a space between the treating fluid supplying part and the wafer supported by the rotating chuck.

15. The apparatus according to claim 13, wherein each treating chamber includes sidewalls defining the upper portion thereof and wherein each treating fluid supplying part covers an upper surface of the sidewalls of a corresponding treating chamber.

* * * * *

UNITED STATES PATENT AND TRADEMARK OFFICE
CERTIFICATE OF CORRECTION

| | |
|---|---|
| PATENT NO. | : 7,387,132 B2 |
| APPLICATION NO. | : 10/437594 |
| DATED | : June 17, 2008 |
| INVENTOR(S) | : Jong-Chul Park |

It is certified that error appears in the above-identified patent and that said Letters Patent is hereby corrected as shown below:

Column 12, line 56, the words "claim 13" should read -- claim 12 --.

Signed and Sealed this

Sixth Day of January, 2009

JON W. DUDAS
*Director of the United States Patent and Trademark Office*